(12) United States Patent
Aota et al.

(10) Patent No.: US 8,174,319 B2
(45) Date of Patent: May 8, 2012

(54) AMPLIFIER

(75) Inventors: Hideyuki Aota, Himeji (JP); Hirofumi Watanabe, Miki (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/004,336

(22) Filed: Jan. 11, 2011

(65) Prior Publication Data

US 2011/0169570 A1    Jul. 14, 2011

(30) Foreign Application Priority Data

Jan. 12, 2010   (JP) .................................. 2010-004398

(51) Int. Cl.
   *H03F 3/16*   (2006.01)
(52) U.S. Cl. ........................................ 330/277; 330/253
(58) Field of Classification Search .................. 330/277, 330/253, 257, 260, 261
   See application file for complete search history.

(56) References Cited

U.S. PATENT DOCUMENTS

| | | | | |
|---|---|---|---|---|
| 6,154,094 | A * | 11/2000 | Seven | 330/252 |
| 6,911,858 | B2 * | 6/2005 | Mori | 327/307 |
| 6,919,766 | B2 * | 7/2005 | Suzuki | 330/252 |
| 7,026,863 | B2 | 4/2006 | Aota | |
| 7,208,931 | B2 | 4/2007 | Aota | |
| 7,215,184 | B2 | 5/2007 | Aota | |
| 7,423,486 | B2 * | 9/2008 | Matsushita | 330/261 |
| 7,426,146 | B2 | 9/2008 | Aota et al. | |
| 7,592,861 | B2 | 9/2009 | Aota | |
| 7,795,856 | B2 | 9/2010 | Aota | |
| 2005/0242870 | A1 | 11/2005 | Aota | |
| 2008/0303588 | A1 | 12/2008 | Aota et al. | |

FOREIGN PATENT DOCUMENTS

| | | |
|---|---|---|
| JP | 2005-150213 | 6/2005 |
| JP | 2005-284544 | 10/2005 |
| JP | 2005-317948 | 11/2005 |
| JP | 2007-66043 | 3/2007 |
| JP | 2007-66046 | 3/2007 |
| JP | 2008-70953 | 3/2008 |
| JP | 2008-152632 | 7/2008 |
| JP | 2008-293409 | 12/2008 |
| JP | 4259941 | 2/2009 |
| JP | 4263056 | 2/2009 |
| JP | 4322732 | 6/2009 |

* cited by examiner

Primary Examiner — Henry Choe
(74) Attorney, Agent, or Firm — Cooper & Dunham LLP

(57) ABSTRACT

An amplifier includes a first amplifier comprising an N-type field-effect transistor receiving a reference voltage at a gate, a P-type field-effect transistor connected between a drain of the N-type field-effect transistor and a power supply voltage line, and a constant current source connected between a source of the N-type field-effect transistor and a ground, to output a voltage from a connection of the drain of the N-type and P-type field-effect transistors; a second amplifier comprising a resistance and P-type field-effect transistors connected in series between the power supply voltage line and the ground to receive the voltage output from the first amplifier at their gate, and outputting a voltage from a connection of the P-type field-effect transistor and the resistance; and a switch between an output of the first amplifier and the power supply voltage line and comprising an N-type field-effect transistor receiving a reference voltage at a gate.

6 Claims, 7 Drawing Sheets

AMPLIFIER

CROSS REFERENCE TO RELATED APPLICATION

The present application is based on and claims priority from Japanese Patent Application No. 2010-004398, filed on Jan. 12, 2010, the disclosure of which is hereby incorporated by reference in its entirety.

BACKGROUND OF THE INVENTION

1. Field of the Invention

The present invention relates to an amplifier which outputs a predetermined voltage.

2. Description of the Related Art

Japanese Patent Application Publication No. 2008-293409 discloses a prior art amplifier circuit which generates a predetermined voltage.

Further, FIG. 13 shows another prior art amplifier which comprises a first amplifier including N-type field-effect transistors (hereinafter, N-type transistor) M1 to M3 and P-type field-effect transistors (hereinafter, P-type transistor) M4 and M5 and a second amplifier which comprises a P-type transistor M6 and resistances R1 and R2.

The N-type transistors M1, M2 of the first amplifier are input transistors whose substrate gates are connected to their respective sources. The sources thereof are connected to each other and the N-type transistor M3 is connected between a connecting point of the sources and a ground terminal GND. The N-type transistor M1 is connected to a reference voltage line Vref at its gate while the N-type transistor M2 is connected to a connecting point of the resistances R1, R2 at its gate.

The substrate gate and source of the N-type transistor M3 are connected to the ground terminal GND, a gate thereof is connected to the reference voltage line Vref and a drain thereof is connected to the sources of the N-type transistors M1, M2, to constitute a constant current source.

The P-type transistors M4, M5 are connected to a power supply voltage line Vcc at their substrate gates and sources and to drains of the N-type transistors M1, M2 at their drains. The gates of the P-type transistors M4, M5 are connected to each other and their connecting point is connected to the drain of the P-type transistor M5, thereby constituting a current mirror circuit.

The P-type transistor M6 of the second amplifier is connected to the power supply voltage line Vcc at its substrate gate and source and to an output Vout of the resistance R1 at its drain. It is also connected at its gate to a connecting point of the drains of the P-type transistor M4 and the N-type transistor M1. The other end of the resistance R1 is connected to the ground terminal GND via the resistance R2. Thus, the P-type transistor M6 of the second amplifier and the resistances R1, R2 constitute a feedback loop relative to the first amplifier.

In the circuit above, since the P-type transistors M4, M5 constitute a current mirror circuit, the same current flows in the N-type transistors M1, M2 and gate potentials thereof coincide with each other. Therefore, the following equation is satisfied:

$$V\text{out} = (R1+R2)/R2 * V\text{ref} \quad (1)$$

For example, when Vref=0.5V (not shown), R1=4,000 KΩ, and R2=2,000 KΩ, Vout=1.5V. In this case both of the minimal operation voltage and the output voltage Vout are 1.5V.

In order to operate the amplifier at a low voltage, both the operation voltage and output voltage Vout need be low. If the resistance R1 is changed to 3,000 KΩ, 2,000 KΩ, 1,000 KΩ in order while the resistance R2 is fixed at 2,000 KΩ, the output voltage Vout is assumed to change to 1.25V, 1.0V, 0.75V. However, at the resistance R1 being 1,000 KΩ or less, the output voltage Vout may sharply rise beyond a designed value as shown in FIG. 14.

This occurs because the minimal operation voltage of the first amplifier and that of the second amplifier differ in magnitude. Their minimal operation voltages MV1, MV2 are expressed by the following equations (2), (3), respectively.

$$MV1 \text{ of the first amplifier} = VdsM4 + VdsM1 + VdsM3 \quad (2)$$

$$MV2 \text{ of the second amplifier} = VdsM6 + V\text{ref} + (R2/R1)*V\text{ref} \quad (3)$$

Due to use of the same P-type transistor, the first terms of the equation (2), (3) are the same value so that the magnitude of the minimal operation voltages of the first and second amplifiers is determined by the magnitude of the sums of the second and third items.

In more detail, at R1 being 3,000 KΩ or 4,000 KΩ, or at R2/R1 being larger than 1 as shown in FIG. 14, the minimal operation voltage of the first amplifier is smaller than that of the second amplifier. After an output 200 of the first amplifier is stabled, the second amplifier starts operating. However, at R1 being 1,000 K, or at R2/R1 being smaller than 1, the minimal operation voltage of the first amplifier is larger than that of the second amplifier. Because of this, the output 200 becomes inconstant in a voltage range beyond the threshold voltage of the P-type transistor M6 before the operation of the first amplifier, disabling control over the P-type transistor M6 so that the P-type transistor M6 is turned on.

Furthermore, referring to FIG. 15, while the power supply voltage Vcc is low, either of the first and second amplifiers does not operate and the output 200 of the first amplifier is at a low level. With an increase in the power supply voltage Vcc, the second amplifier alone starts operating. The output 200 remains at a low level since the first amplifier is not in operation. When the P-type transistor M6 is brought into an ON-state, the output voltage Vout rises along with an increase in the power supply voltage Vcc (Vout=Vcc). With a further increase in the power supply voltage Vcc, the first amplifier starts operating with the second amplifier and outputs a voltage V200 to the output 200. This can control the P-type transistor M6 to make the output voltage Vout stable at a constant voltage. However, at R1 being 1,000 KΩ, since the first amplifier starts operating after the output voltage Vout sharply rises to about 1V, the output voltage Vout becomes stabled after sharply exceeding a designed value (0.75V).

SUMMARY OF THE INVENTION

The present invention aims to provide an amplifier which can stably operate to generate an output voltage without a sharp rise.

According to one aspect of the present invention, an amplifier comprises: a first amplifier comprising an N-type field-effect transistor which receives a reference voltage at a gate, a P-type field-effect transistor connected between a drain of the N-type field-effect transistor and a power supply voltage line, and a constant current source connected between a source of the N-type field-effect transistor and a ground terminal, the first amplifier outputting a voltage from a connecting point of the drain of the N-type field-effect transistor and the P-type field-effect transistor; a second amplifier comprising a resistance, and a P-type field-effect transistor connected in series between the power supply voltage line and the ground terminal, the second amplifier receiving the voltage output from the first amplifier at a gate of the P-type field-effect transistor and outputting a voltage from a connecting point of the P-type field-effect transistor and the resistance; and a switch provided between an output of the first amplifier and the power supply voltage line and comprising an N-type field-effect transistor which receives a reference voltage at a gate.

BRIEF DESCRIPTION OF THE DRAWINGS

Features, embodiments, and advantages of the present invention will become apparent from the following detailed description with reference to the accompanying drawings.

DETAILED DESCRIPTION OF THE PREFERRED EMBODIMENTS

Hereinafter, embodiments of the present invention will be described in detail with reference to the accompanying drawings.

First Embodiment

Figure 1:
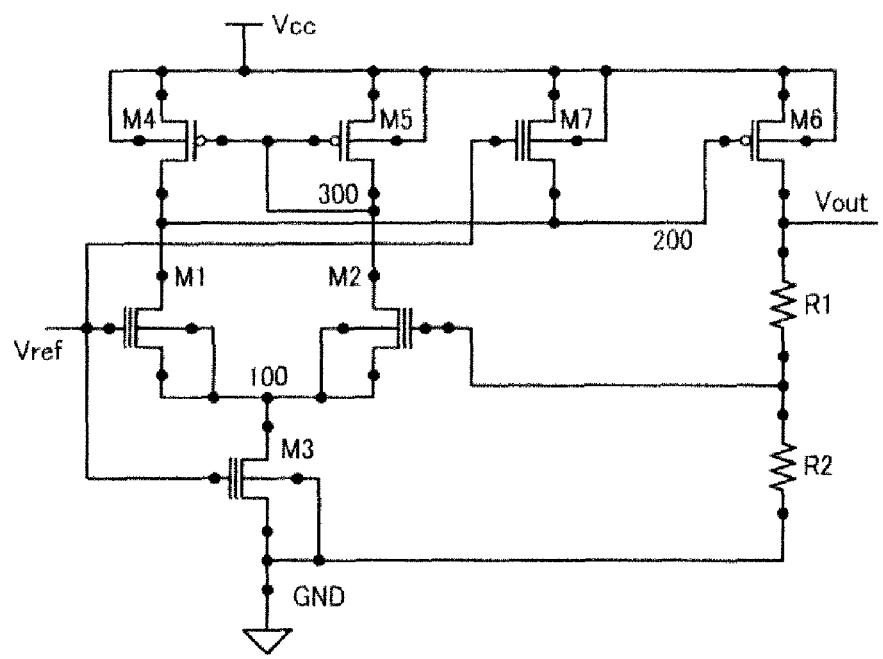
FIG. 1 shows a circuit diagram of an amplifier according to a first embodiment of the present invention by way of example.

FIG. 1 is a circuit diagram of an amplifier according to a first embodiment of the present invention. The amplifier comprises a first amplifier including N-type field-effect transistors (hereinafter, N-type transistor) M1 to M3 and P-type field-effect transistors (hereinafter, P-type transistor) M4 and M5, a second amplifier which comprises a P-type transistor M6 and resistances R1 and R2, and an N-type transistor M7 as a switch.

The N-type transistors M1, M2 of the first amplifier are input transistors whose substrate gates are connected to their respective sources. The sources thereof are connected to each other and the N-type transistor M3 is connected between a connecting point of the sources and a ground terminal GND. The N-type transistor M1 is connected to a reference voltage line Vref at its gate while the N-type transistor M2 is connected to a connecting point of the resistances R1, R2 at its gate.

The substrate gate and source of the N-type transistor M3 are connected to the ground terminal GND, a gate thereof is connected to the reference voltage line Vref and a drain thereof is connected to the sources of the N-type transistors M1, M2, to constitute a constant current source.

The P-type transistors M4, M5 are connected to the power supply voltage line Vcc at their substrate gates and sources and to drains of the N-type transistors M1, M2 at their drains. The gates of the P-type transistors M4, M5 are connected to each other and their connecting point is connected to the drain of the P-type transistor M5, thereby constituting a current mirror circuit. Accordingly, the same current is flowed in the N-type transistors M1 and M2 and the gate potentials of the transistors M1, M2 as input transistors coincide with each other.

The P-type transistor M6 of the second amplifier is connected to the power supply voltage line Vcc at its substrate gate and source and to an output Vout of the resistance R1 at its drain. The gate thereof is connected to a connecting point of the drains of the P-type transistor M4 and the N-type transistor M1. The other end of the resistance R1 is connected to the ground terminal GND via the resistance R2. Thus, the resistances R1, R2 constitute a feedback loop relative to the first amplifier.

The N-type transistor M7 for switch is connected to the power supply voltage line Vcc at its substrate gate and drain, to the reference voltage line Vref at its gate, and to a connecting point (gate of the P-type transistor M6 of the second amplifier) of the N-type transistors M1, M4 at its source.

Figure 15:
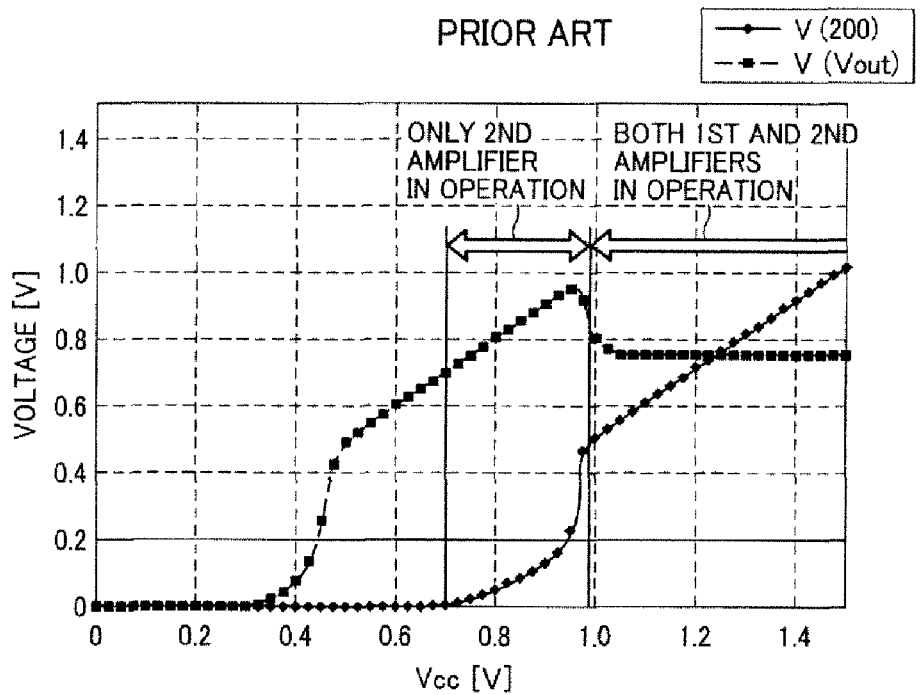
FIG. 15 is a graph showing a characteristic of a voltage relative to the power supply voltage Vcc in the prior art amplifier.

For example, at the reference voltage Vref being 0.5V, the resistance R1 being 1,000 KΩ, and the resistance R2 being 2,000 KΩ, the second amplifier rises first and then the first amplifier starts operating. At the same time the reference voltage Vref of 0.5V is supplied to the gates of the N-type transistors M1, M3, M7. While the second amplifier is in operation but the first amplifier is not with the reference voltage of 0.5V supplied (during a period in which the power supply voltage Vcc is from 0.7V to 1.0V in FIG. 15), with an increase in the power supply voltage Vcc, a current flows from the power supply source (Vcc) to the N-type transistor M7, the N-type transistor M1, and the N-type transistor M3 in this order and a voltage of the output 200 rises from the reference voltage Vref to the threshold voltage VthM7 of the N-type transistor M7.

Here, the threshold voltages VthM6, VthM7 are set to satisfy the following relation:

|VthM7|<|VthM6|

Figure 2:
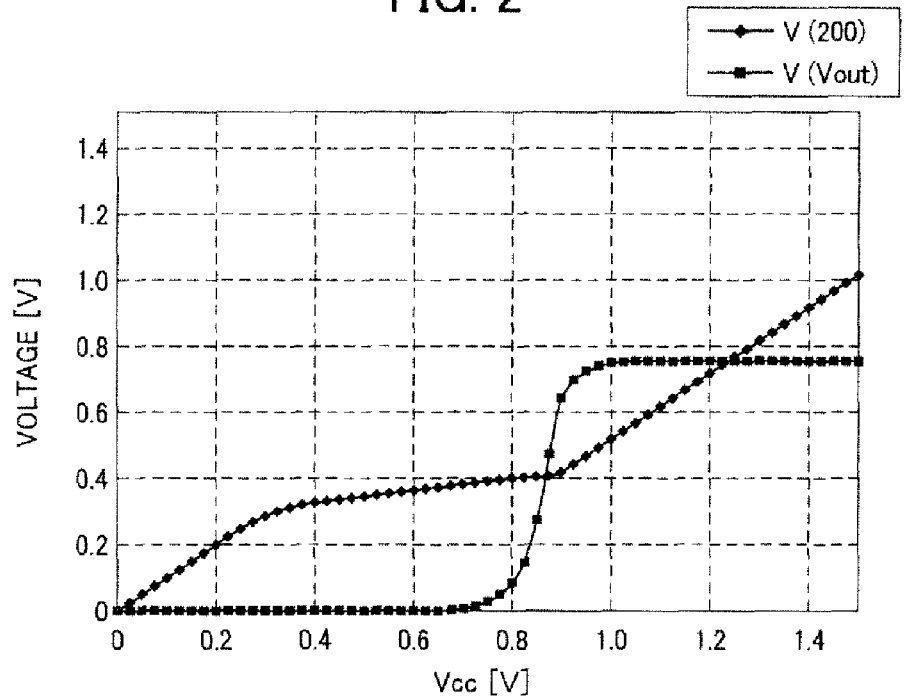
FIG. 2 is a graph showing a characteristic of a power supply voltage Vcc relative to a voltage V200.
Figure 3:
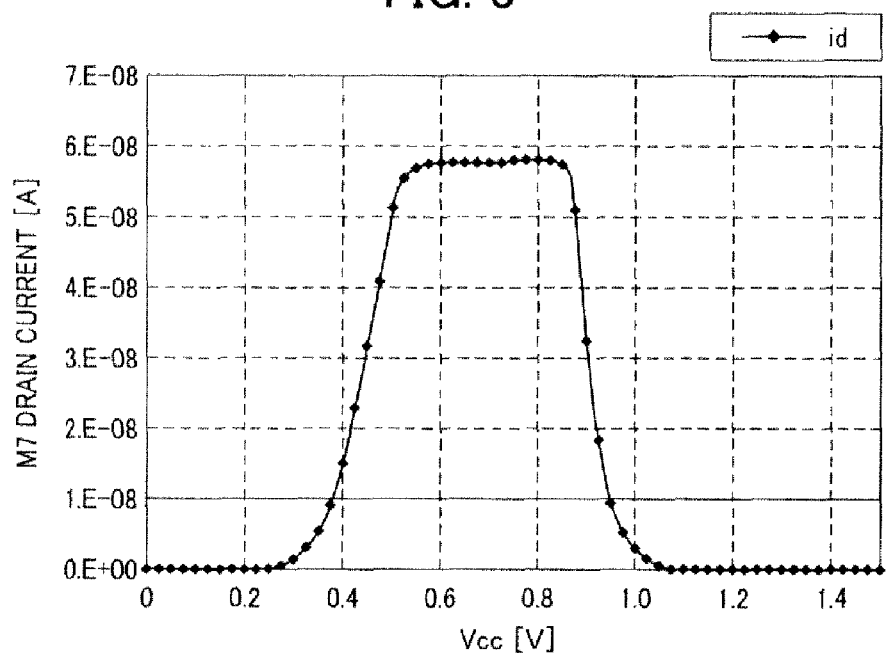
FIG. 3 shows a graph showing a characteristic of a drain current of an N-type transistor relative to the power supply voltage Vcc.

This allows a difference between the power supply voltage Vcc and the voltage of the output 200 not to exceed the threshold voltage VthM6 and not to turn on the P-type transistor M6. With a further increase in the power supply voltage Vcc, the first amplifier starts operating and the voltage of the output 200 becomes higher than reference voltage Vref. Because of this, the N-type transistor M7 is turned off since the voltage thereof remains under the threshold voltage VthM7 even with the reference voltage Vref supplied to its gate, as shown in FIG. 2. Further, from FIG. 3 showing a drain current of the N-type transistor M7 in operation, the N-type transistor M7 as a switch is turned on only during the sole operation of the second amplifier. Accordingly, incorporating the N-type transistor M7 as a switch in the amplifier makes it possible to delay the operation of the second amplifier by not turning on the P-type transistor M6 until the first amplifier starts operation. That is, it is possible to have the minimal operation voltage of the second amplifier be higher than that of the first amplifier, realizing generation of the output voltage Vout without a sharp rise as shown in FIG. 2.

Second Embodiment

Figure 13:
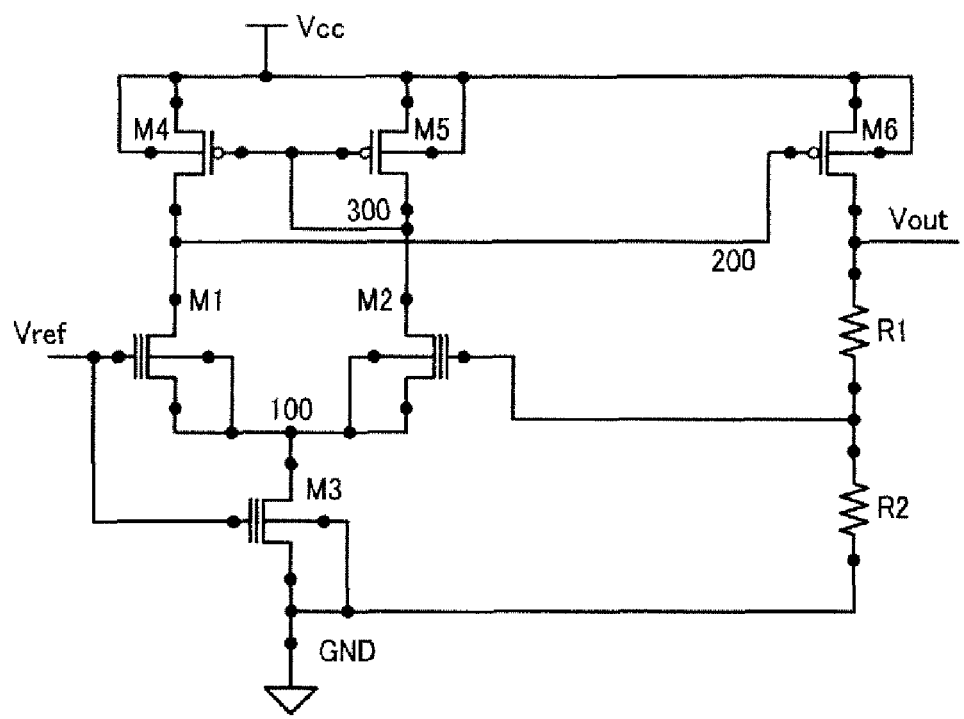
FIG. 13 is a circuit diagram of a prior art amplifier by way of example.
Figure 14:
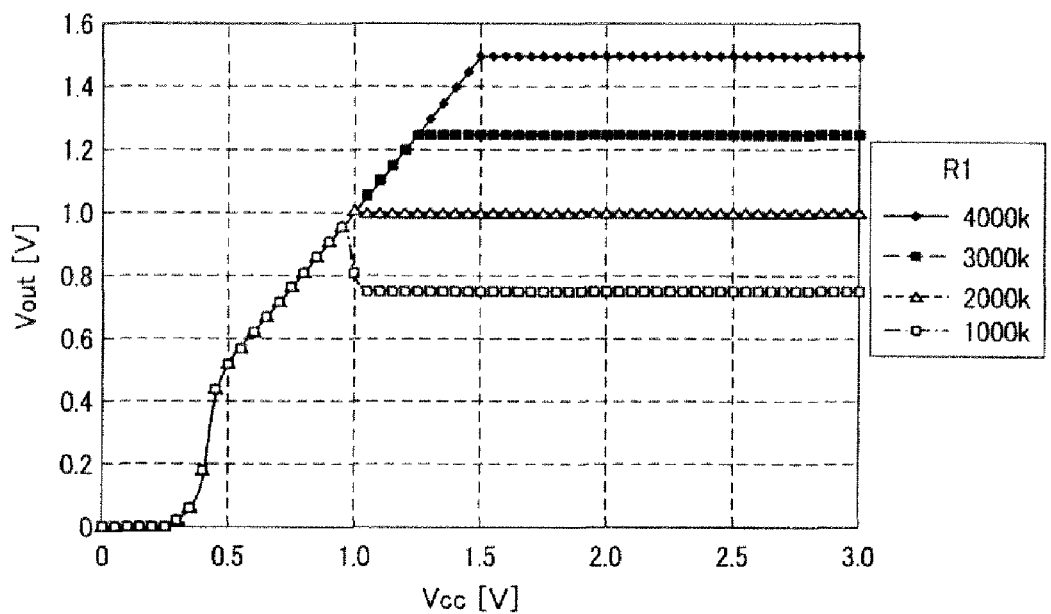
FIG. 14 a graph showing a characteristic of an output voltage Vout relative to the power supply voltage Vcc in the prior art amplifier.

Now, an amplifier according to a second embodiment is described. The amplifier in the present embodiment is the same in configuration as that in FIG. 13. However, the threshold voltages VthM4, VthM5, VthM6 of the P-type transistors M4, M5, M6 are set to satisfy the following relations:

VthM4<VthM6

VthM5<VthM6

Figure 4:
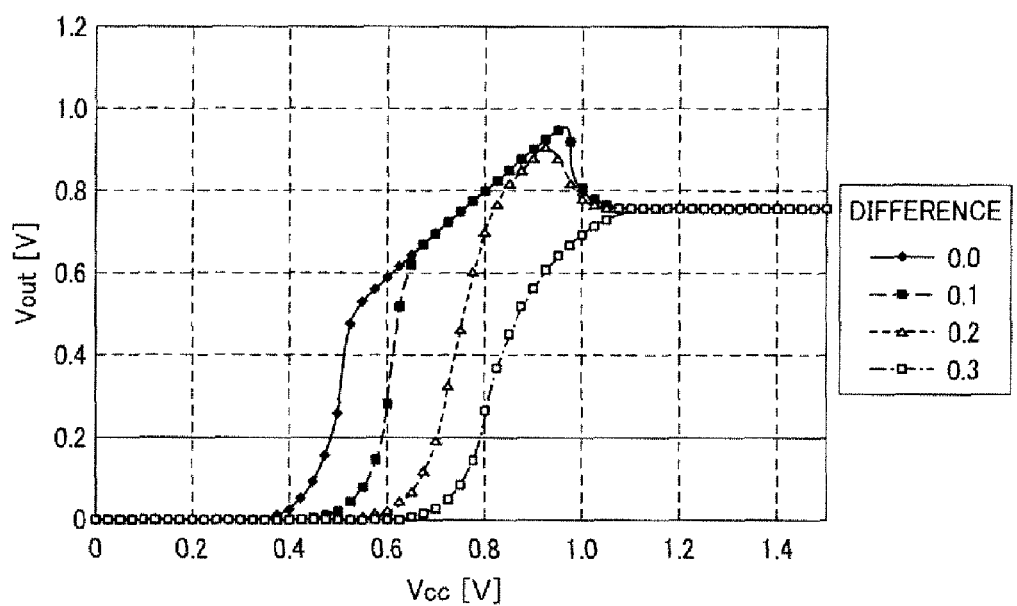
FIG. 4 shows a graph showing a characteristic of an output voltage Vout relative to the power supply voltage Vcc according to a second embodiment of the present invention.

By setting the threshold voltages as above, it is possible to set the minimal operation voltage of the first amplifier to be smaller than that of the second amplifier and prevent a sharp rise of the output voltage Vout. FIG. 4 shows a relation between the power supply voltage Vcc and the output voltage Vout while differences among the threshold voltages VthM4, VthM5, VthM6 are changed. It is apparent from the drawing that a sharp rise of the output voltage Vout does not occur with a difference in the threshold voltages Vth being 0.3V or more. Note that two kinds of P-type transistors with different threshold voltages can be manufactured by using two types of channel dopes, using a single type of channel dope and setting the gate density of the P-type transistor M6 to be lower than that of the P-type transistors M4, M5 by about one digit, or the like.

Third Embodiment

Figure 5:
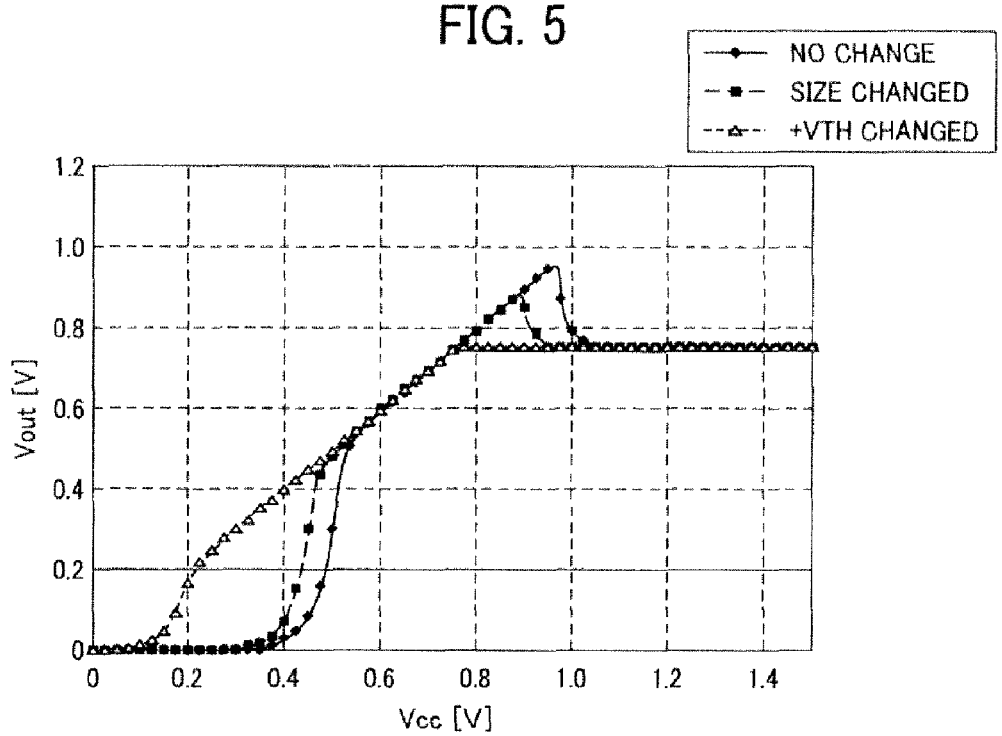
FIG. 5 shows a graph showing a characteristic of an output voltage Vout relative to the power supply voltage Vcc according to a third embodiment of the present invention.

An amplifier according to a third embodiment is described. The amplifier according to the present embodiment is the same in configuration as that in FIG. 13. However, aiming at having the output 200 rise at an earlier timing than that in FIG. 13, current supply amounts of the P-type transistors M4, M5 are increased and a capacitance of the N-type transistor M3 to flow current is decreased in the present embodiment. Specifically, the threshold voltages VthM4, VthM5 of the P-type transistors M4, M5 are lowered and the sizes thereof are increased from those in FIG. 13 while the threshold voltage VthM3 of the N-type transistor M3 is heightened and the size thereof is decreased from those in FIG. 13. As a result, at power-on, the second amplifier is set to start operating at a higher voltage than the first amplifier, as shown in FIG. 5. In FIG. 5, for example, the sizes of the P-type transistors M4, M5 are doubled as those in FIG. 13 and the size of the N-type transistor is a half of that in FIG. 13, which contributes to a reduction in a sharp rise of the voltage Vout. Further, the threshold voltages Vth of the P-type transistors M4, M5 are decreased by 0.1V and the threshold voltage Vth of the N-type transistor M3 is increased by 0.1 v, which allows the operation start voltage of the second amplifier to be higher than that of the first amplifier. Such a voltage adjustment in addition to the size change of the transistors results in elimination of a sharp rise in the output voltage Vout. Specifically, for example, when in the prior art the transistor size W/L of the P-type transistors M4, M5 is 20/5, the threshold voltage Vth thereof is −0.64V, and the transistor size W/L of the N-type transistor M3 is 10/20, and the threshold voltage Vth is 0.24V, in the present embodiment the transistor size W/L of the P-type transistors M4, M5 is doubled to 40/5 and the threshold voltage Vth is set at −0.54 lower than the prior art one by 0.1V, and the transistor size W/L of the N-type transistor NM3 is set to be half at 10/40 and the threshold voltage Vth thereof is set at 0.34 higher than the prior art one by 0.1V.

Fourth Embodiment

Figure 6:
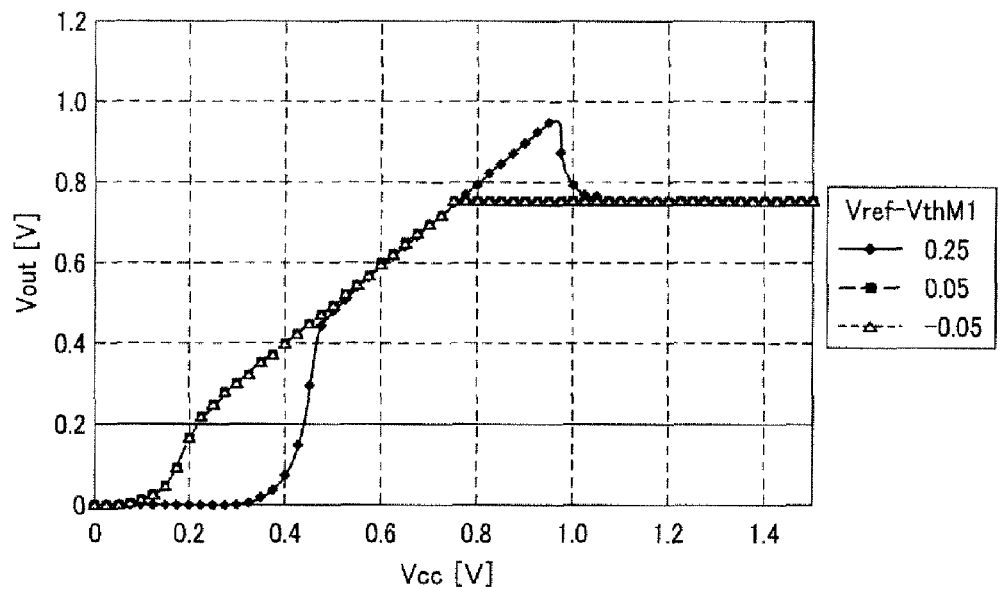
FIG. 6 shows a graph showing a characteristic of an output voltage Vout relative to the power supply voltage Vcc according to a fourth embodiment of the present invention.

An amplifier according to a fourth embodiment is described. The amplifier according to the present embodiment is the same in configuration as that in FIG. 13. However, in the present embodiment the minimal operation voltage of the first amplifier is set to a lower value by decreasing the coefficient VdsM1 in the above expression (2). Specifically, VthM1 is set to 0.45V relative to the reference voltage Vref being 0.5V so that Vref to VthM1 is set about 0V. In other words, the source-drain voltage of the N-type transistor M1 is set to about 0V. Alternatively, Vref to VthM1 can be set to a negative value, i.e., the N-type transistor M1 can be set to operate in a sub-threshold voltage range. FIG. 6 shows a change of the output voltage Vout when Vref to VthM1 is set to 0.25V, 0.05V, and −0.05V. It is apparent from the drawing that there is no sharp rise in the output voltage Vout at Vref-VthM1 being 0.05V and −0.05V in the sub-threshold voltage range.

Next, a reference voltage generator circuit generating a low reference voltage Vref of 0.5 according to the above embodiments is described. The minimal operation voltage of the low reference voltage generator circuit has to be lower than those of the N-type transistors M1, M3, M7 since it needs to input the reference voltage Vref to the gates of the N-type transistors M1, M3, M7 before the operation of the first and second amplifiers, as described in the first embodiment.

Figure 7:
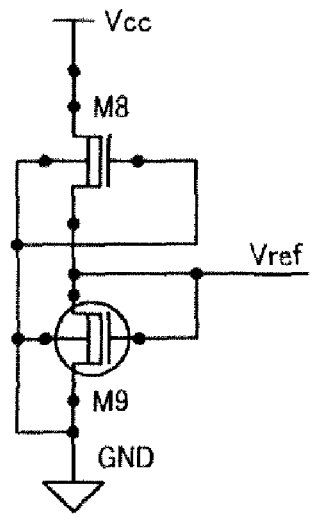
FIG. 7 shows an example of a low reference voltage generator circuit.

FIG. 7 shows an example of a configuration of the low reference voltage generator circuit which comprises N-type transistors M8, M9 connected in series between the power supply voltage line Vcc and the ground terminal GND.

The N-type transistors M8, M9 are depression type transistors in which a substrate and a channel dope is set to have the same impurity density, and they are formed in a P-well of an N-type substrate. Their substrate potentials coincide with the source potential. The N-type transistor M8 includes a high density N-type gate while the N-type transistor M9 includes a high density P-type gate. The N-type transistor M8 is connected between the gate and the ground terminal GND to form a constant current source. The gate and drain of the N-type transistor M9 are connected to each other.

In such a circuit the same current Id is flowed in the N-type transistors M8, M9. The current Id is obtained by the following expression:

$$Id = KM8 \times (VgsM8 - VthM8)^2 = KM9 \times (VgsM9 - VthM9)^2$$

where KM8 is a conductive coefficient of the N-type transistor M8, KM9 is a conductive coefficient of the N-type transistor M9, VgsM8 is a gate to source voltage of the N-type transistor M8, VgsM9 is a gate to source voltage of the N-type transistor M9, VthM8 is a threshold voltage of the N-type transistor M8 and VthM9 is a threshold voltage of the N-type transistor M9. Here, since VgsM8=−VgsM9 holds true, VgsM9=(−(KM8/KM9)$^{1/2}$×VthM8+VthM9)/((KM8/KM9)$^{1/2}$+1). When the conductive coefficients KM8, KM9 are equal to each other, the reference voltage Vref will be expressed by the following equation (4):

$$Vref=VgsM9=½(-VthM8+VthM9)$$

Thus, the reference voltage Vref is a half of a difference between the threshold voltages VthM8, VthM9 of the N-type transistors M8, M9.

There are mainly three advantageous features of the reference voltage generator circuit according to any of the above embodiments of the present invention.

Figure 8:
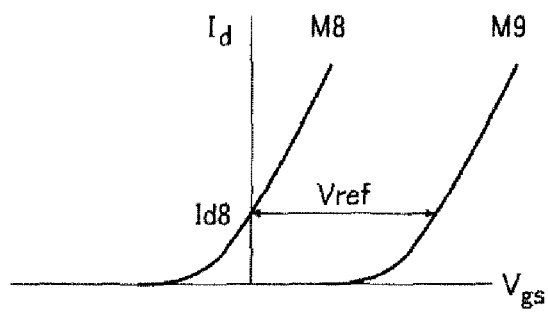
FIG. 8 shows an example of a characteristic of Vgs to Id of the N-type transistors M1, M2.
Figure 9:
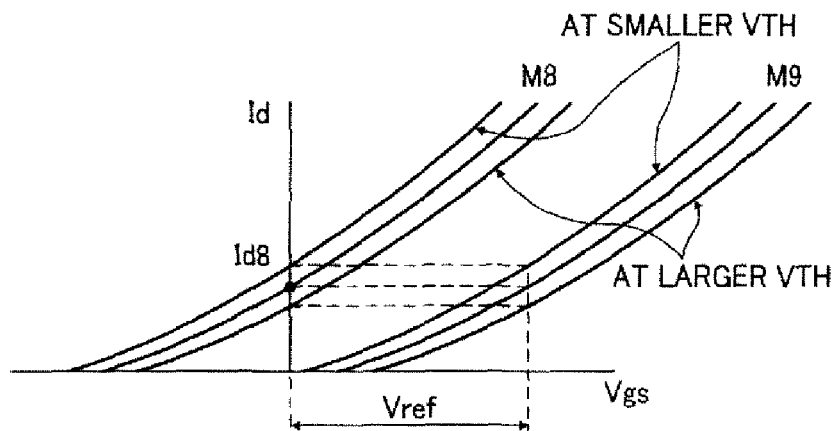
FIG. 9 shows a deviation in the characteristic of Vgs to Id of the N-type transistors M1, M2 due to a process fluctuation.

First, it can stably generate a reference voltage Vref irreverent of a process variation. FIG. 8 shows Vgs to Id curves of the N-type transistors M8, M9. The N-type transistor M8 is connected to the ground terminal GND at its gate and a current Id8 is flowed therein. Also, the current Id8 is flowed in the N-type transistor M9 connected in series to the N-type transistor M8. Then, a difference between the gate to source voltages of the N-type transistors M8, M9 is the reference voltage Vref. If impurity density of a substrate or a channel dope is deviated due to a process variation, the densities of the N-type transistors M8, M9 are deviated accordingly but the Vgs to Id curves of the N-type transistor M8, M9 are just shifted rightward or leftward in FIG. 9. That is, the deviation in the impurity density does not affect the absolute value of the reference voltage Vref, and a reference voltage Vref can be stabilized.

Figure 10:
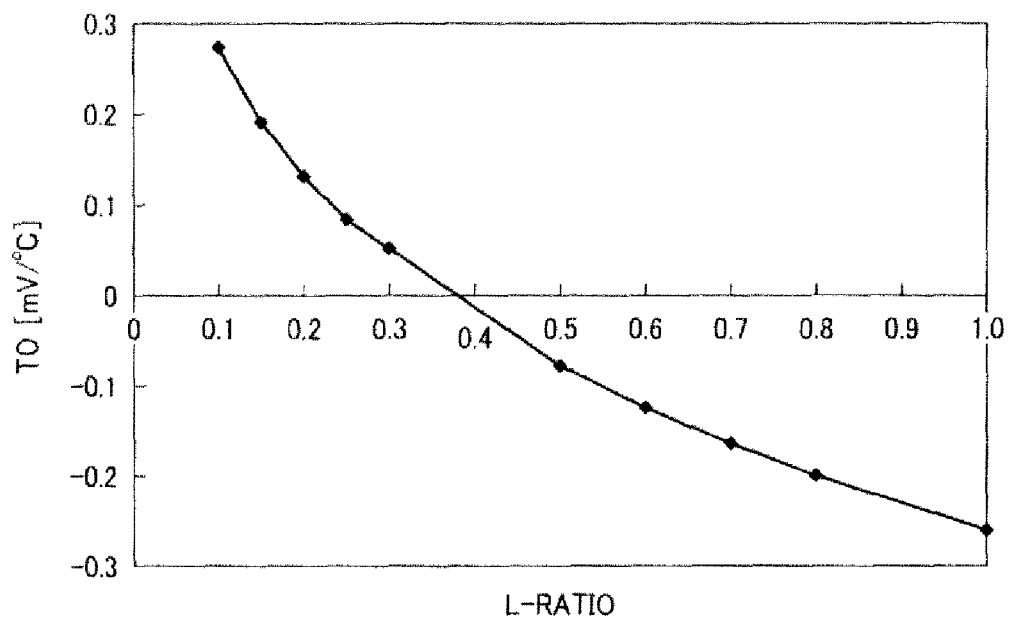
FIG. 10 is a graph showing a temperature characteristic of the reference voltage Vref relative to a ratio S2/S1.

Secondly, the reference voltage generator circuit exerts a good temperature characteristic. The depression type N-type transistors M8, M9 include high density N-type and P-type gates respectively. Because of this, even if the temperature characteristics of potential differences in the channel regions of these transistors are set to be equal by setting the conductive coefficients of the equation (4) to the same value, the temperature characteristic of an obtained reference voltage Vref will be about −500 ppm/degree since the temperature characteristic results from a difference in work functions of the gates. In view of improving this, a ratio S8 (W/L) of channel width W and channel length L of the N-type transistor M8 and a ratio S9 (W/L) of channel width W and channel length L of the N-type transistor M9 are adjusted. FIG. 10 shows experimental data of the temperature characteristic TO relative to the ratio S9/S8 (L ratio). It is seen from the drawing that the minimal point of the temperature characteristic is in a range from 0.25 to 0.5 of the ratio S9/S8. The optimal ratio for the minimal point is estimated to 0.36 to 0.40 and the temperature characteristic will be about 40 ppm/degree.

Thirdly, it can stably generate the reference voltage Vref even with a fluctuation in the power supply voltage Vcc. The source to drain voltages VdsM8, VdsM9 of the N-type transistors M8, M9 are obtained by the following equations.

$$VdsM8=Vcc-Vref$$

$$VdsM9=Vref$$

Figure 11:
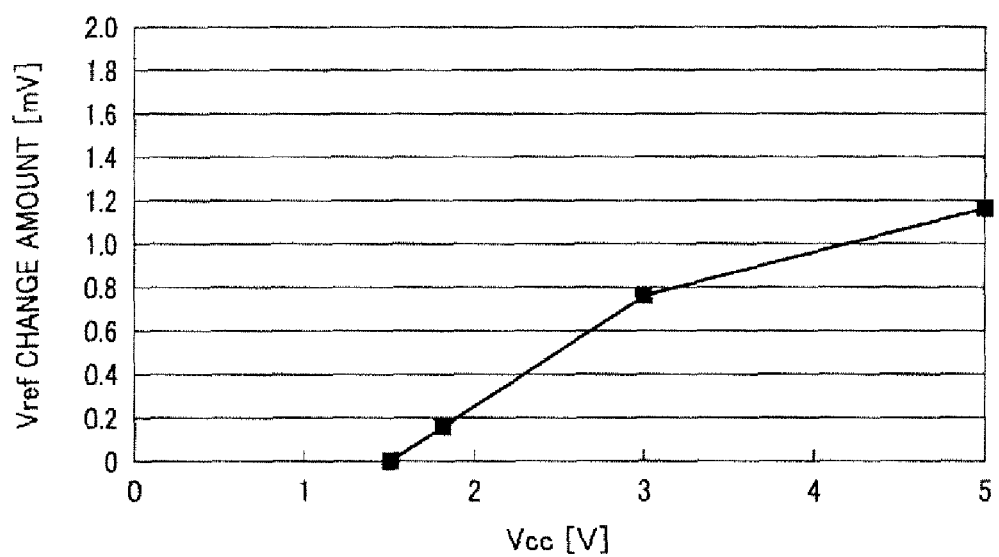
FIG. 11 shows experimental data indicating reference voltage Vref's dependency on the power supply voltage Vcc.

Because of this, a fluctuation in the power supply voltage Vcc changes the source to drain voltages of the N-type transistors M8, M9, affecting the reference voltage Vref. However, this poses little problem for the reference voltage generator circuit according to the present invention since it is configured to generate a lower voltage. FIG. 11 shows a change amount of the reference voltage Vref relative to the power supply voltage Vcc. In the drawing at Vcc being 3V, the change amount of the reference voltage Vref is about 0.8 mV and a change rate is 0.16%. Thus, this reference voltage generator circuit can generate a stable reference voltage Vref even with a fluctuation in the power supply voltage Vcc.

Figure 12:
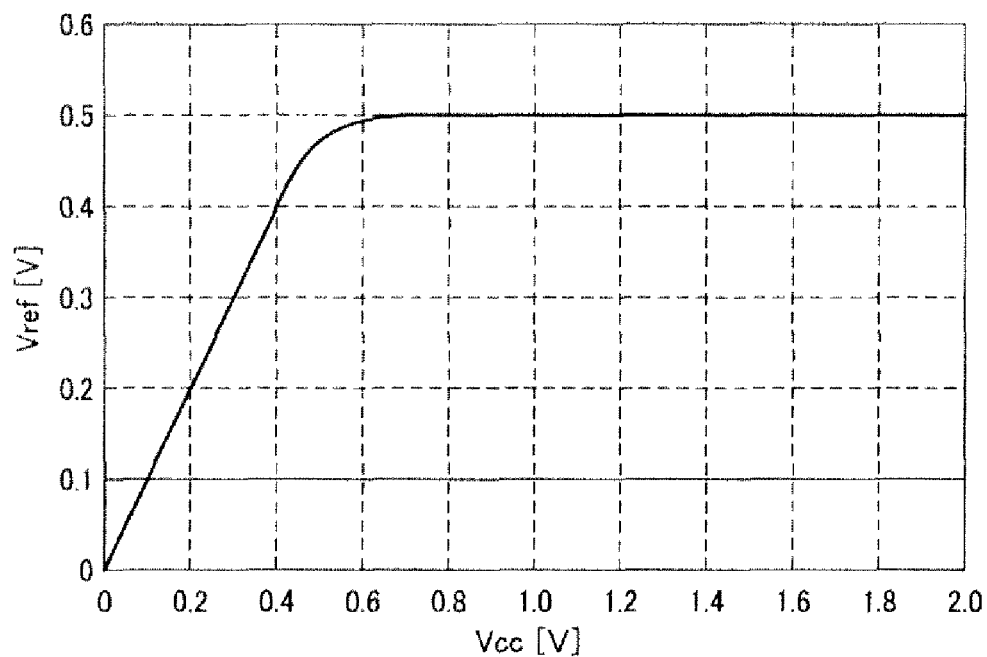
FIG. 12 is a graph showing a characteristic of the reference voltage Vref relative to the power supply voltage Vcc in the reference voltage generator circuit.

FIG. 12 shows a test result of a characteristic of the reference voltage Vref relative to the power supply voltage Vcc. As shown in the drawing the reference voltage Vref of about 0.5V is obtained when the operation voltage is about 0.6V. Accordingly, the minimal operation voltage of the reference voltage generator circuit is lower than those of the first and second amplifiers.

As described through the above embodiments, the present invention is able to provide an amplifier which can stably operate at a low voltage, in particular, a voltage lower than 1V and generate the output voltage without a sharp rise.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:
1. An amplifier comprising:
a first amplifier comprising
an N-type field-effect transistor which receives a reference voltage at a gate, a P-type field-effect transistor connected between a drain of the N-type field-effect transistor and a power supply voltage line, and a constant current source connected between a source of the N-type field-effect transistor and a ground terminal, the first amplifier outputting a voltage from a connecting point of the drain of the N-type field-effect transistor and the P-type field-effect transistor;
a second amplifier comprising a resistance, and a P-type field-effect transistor connected in series between the power supply voltage line and the ground terminal, the second amplifier receiving the voltage output from the first amplifier at a gate of the P-type field-effect transistor and outputting a voltage from a connecting point of the P-type field-effect transistor and the resistance; and
a switch provided between an output of the first amplifier and the power supply voltage line and comprising an N-type field-effect transistor which receives the reference voltage at a gate.
2. An amplifier according to claim 1, wherein
a threshold voltage of the P-type field-effect transistor of the first amplifier is set to be higher than that of the P-type field-effect transistor of the second amplifier.
3. An amplifier according to claim 1, wherein
sizes or threshold voltages of the P-type field-effect transistor and the N-type field-effect transistor of the first amplifier are set so that at power-on, the second amplifier starts operating at a higher voltage than the first amplifier.
4. An amplifier according to claim 1, wherein
the N-type transistor of the first amplifier operates at a source-to-drain voltage close to 0V.
5. An amplifier according to claim 4, wherein
the N-type transistor of the first amplifier operates at a voltage in a sub-threshold range.
6. An amplifier according to claim 1, further comprising
a reference voltage generator circuit which generates and supplies a reference voltage and comprises a first field-effect transistor having a high density N-type gate and a second field-effect transistor having a high-density P-type gate that are connected in series between the power supply voltage line and the ground terminal, wherein:

substrate potentials of the first and second field-effect transistors are grounded;
the gate of the first field-effect transistor is grounded;
the gate of the second field-effect transistor is connected with a connecting point of the first and second field-effect transistors and receives the reference voltage output from the connecting point.

* * * * *